United States Patent
Watanabe et al.

(10) Patent No.: US 7,777,227 B2
(45) Date of Patent: Aug. 17, 2010

(54) NON-VOLATILE SEMICONDUCTOR STORAGE DEVICE AND MANUFACTURING METHOD THEREOF

(75) Inventors: Hiroshi Watanabe, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 11/834,886

(22) Filed: Aug. 7, 2007

(65) Prior Publication Data
US 2008/0283839 A1 Nov. 20, 2008

(30) Foreign Application Priority Data
Dec. 18, 2006 (JP) ............... 2006-340201

(51) Int. Cl.
*H01L 29/04* (2006.01)
(52) U.S. Cl. ............ 257/66; 257/314; 257/315; 257/E21.441; 438/166; 438/149; 365/185.01; 365/185.33
(58) Field of Classification Search ............ 257/66.314, 257/E29.003, E21.441, 315; 438/166, 149, 438/151, 157; 365/185.26, 185.33
See application file for complete search history.

(56) References Cited

U.S. PATENT DOCUMENTS

| | | | | |
|---|---|---|---|---|
| 5,751,631 A | * | 5/1998 | Liu et al. ............ | 365/185.01 |
| 2002/0142546 A1 | * | 10/2002 | Kouznetsov et al. ....... | 438/257 |
| 2006/0049449 A1 | | 3/2006 | Iino et al. | |
| 2007/0102749 A1 | | 5/2007 | Shirota et al. | |
| 2007/0138536 A1 | | 6/2007 | Arai et al. | |

FOREIGN PATENT DOCUMENTS

| | | |
|---|---|---|
| JP | 2000-12712 | 1/2000 |
| JP | 2001-284474 | 10/2001 |
| JP | 2002-110543 A | 4/2002 |
| JP | 2002-118183 | 4/2002 |
| JP | 2002-164446 A | 6/2002 |
| JP | 2005-79277 | 3/2005 |
| JP | 2005-101588 | 4/2005 |
| JP | 2005-285935 | 10/2005 |
| JP | 2006-13534 | 1/2006 |

OTHER PUBLICATIONS

U.S. Appl. No. 11/963,046, filed Dec. 21, 2007, Arai et al.
Suryanarayana S. Bhattacharya, et al., "Temperature Dependence of the Anomalous Leakage Current in Polysilicon-on-Insulator MOSFET's," IEEE Transactions on Electron Devices, vol. 41, No. 2, Feb. 1994, pp. 221-227.

* cited by examiner

*Primary Examiner*—Thinh T Nguyen
(74) *Attorney, Agent, or Firm*—Oblon, Spivak, McClelland, Maier & Neustadt, L.L.P.

(57) ABSTRACT

A non-volatile semiconductor storage device includes a substrate, a first insulating layer formed on the substrate, a semiconductor layer formed of polysilicon on the first insulating layer, a pair of conductor regions formed on the first insulating layer to pass through the semiconductor layer and to sandwich a part of the semiconductor layer, and formed of a metal or a silicide, a tunnel layer formed on the part of the semiconductor layer sandwiched between the pair of conductor regions, a charge storage layer formed on the tunnel layer, a second insulating layer formed on the charge storage layer, and a control gate formed on the second insulating layer.

13 Claims, 15 Drawing Sheets

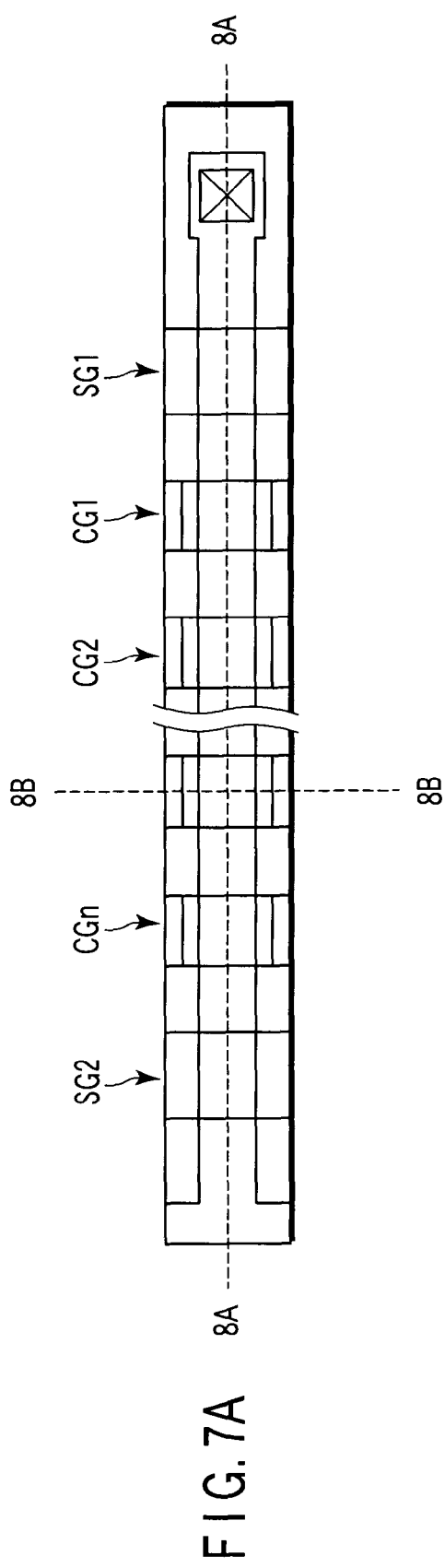
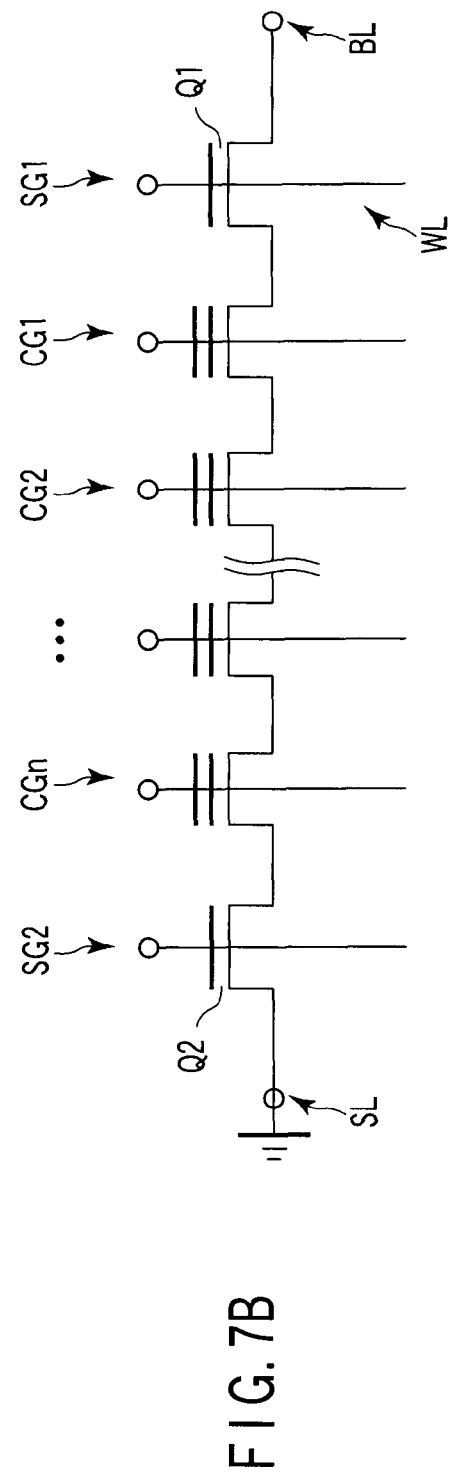
FIG. 7A
FIG. 7B

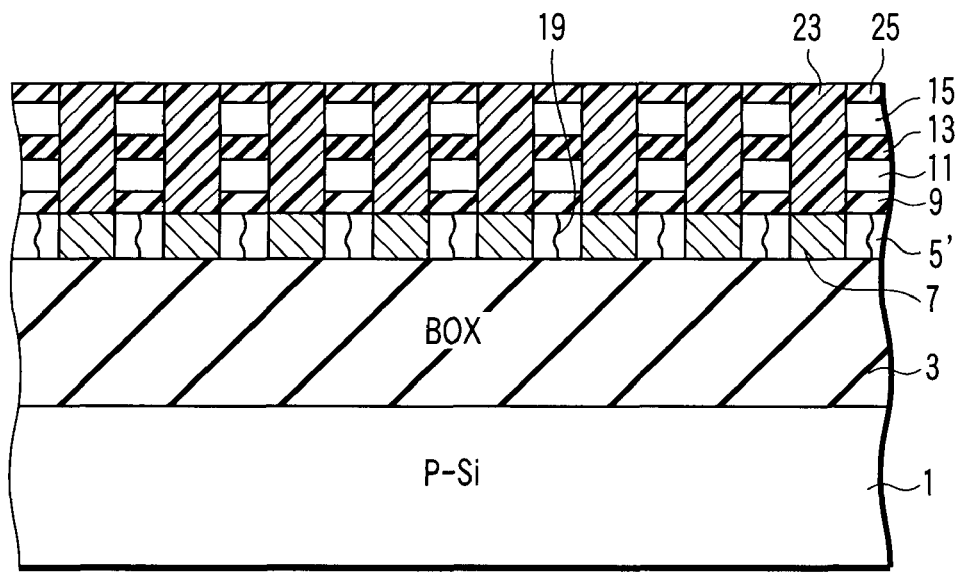
F I G. 15
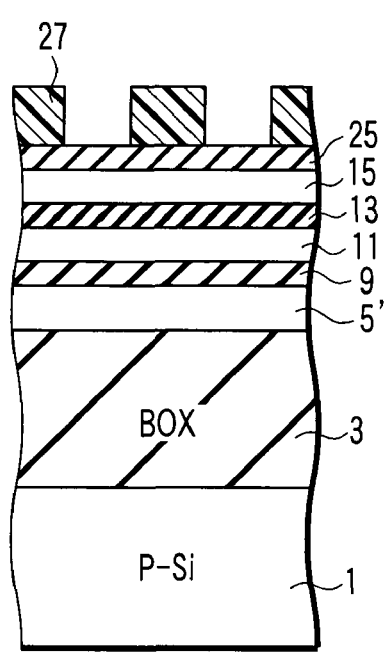
F I G. 16A
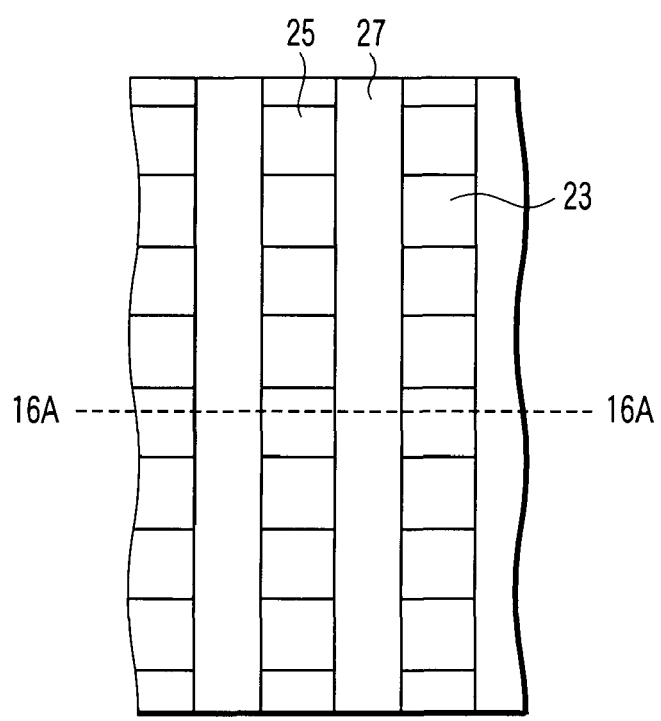
F I G. 16B

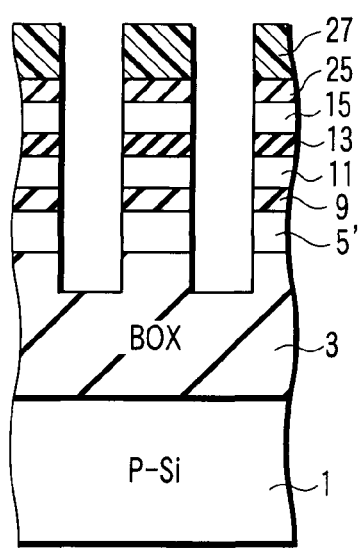
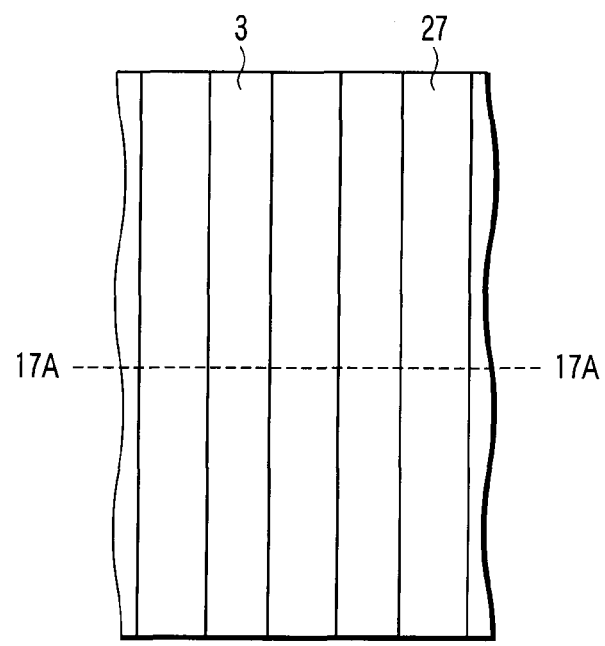
FIG. 17A    FIG. 17B
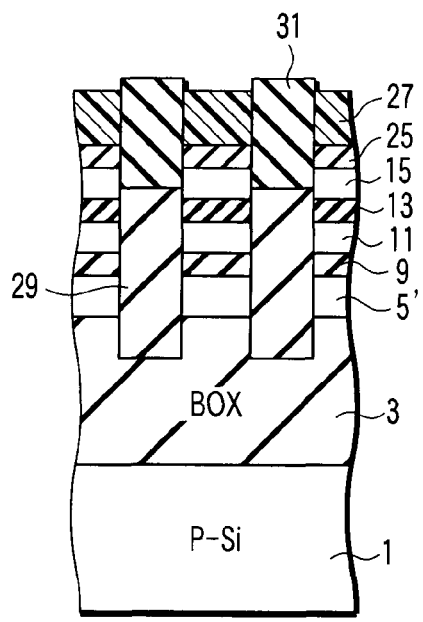
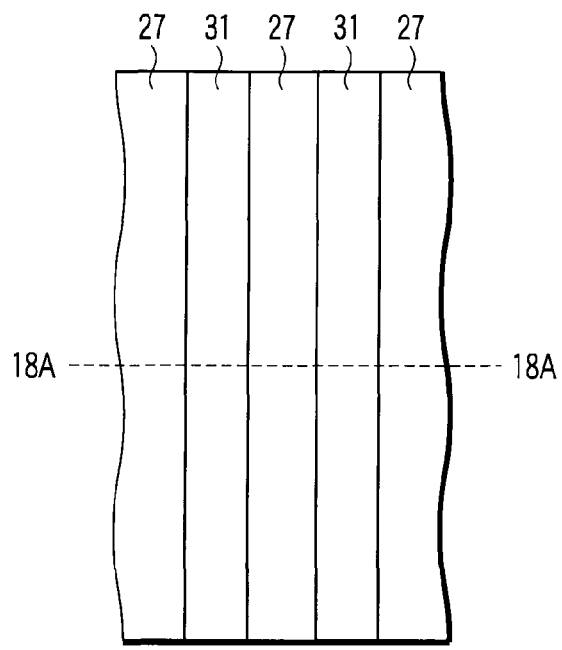
FIG. 18A    FIG. 18B

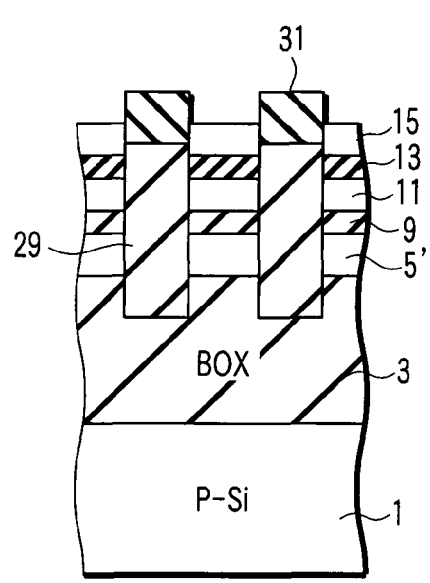 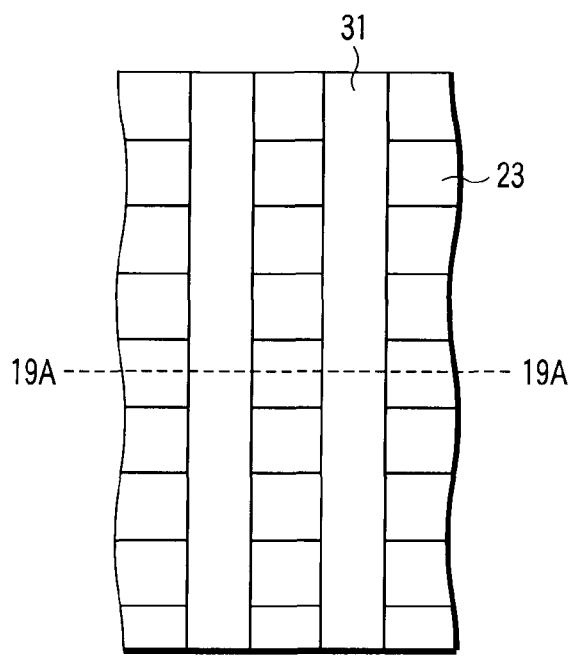
FIG. 19A  FIG. 19B
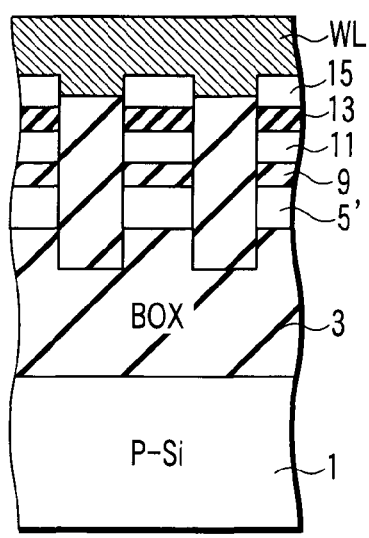 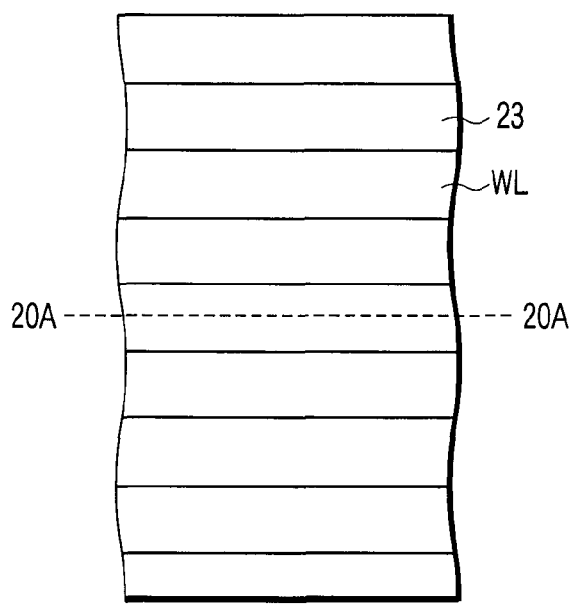
FIG. 20A  FIG. 20B

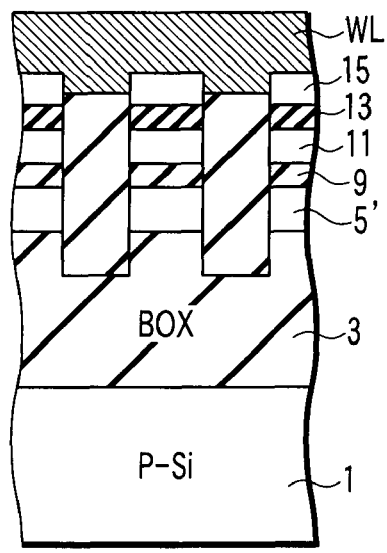
F I G. 21A
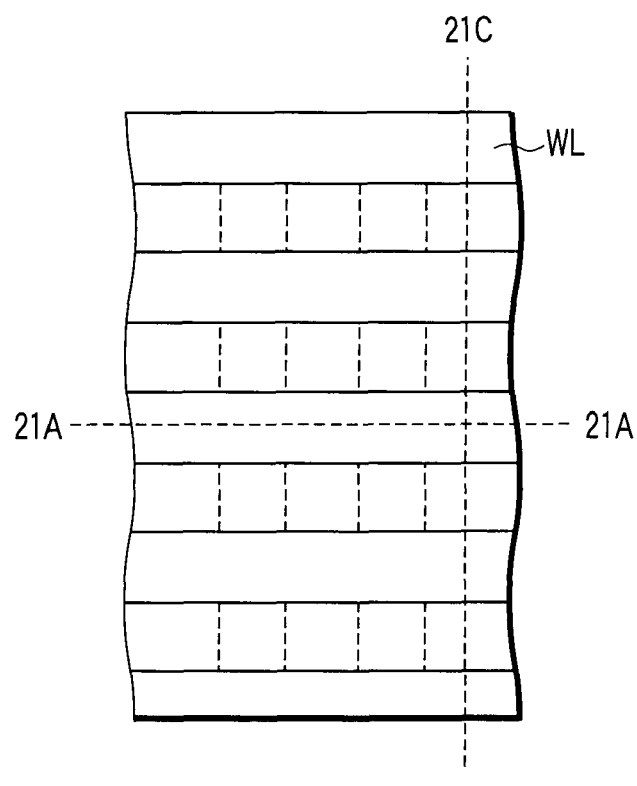
F I G. 21B
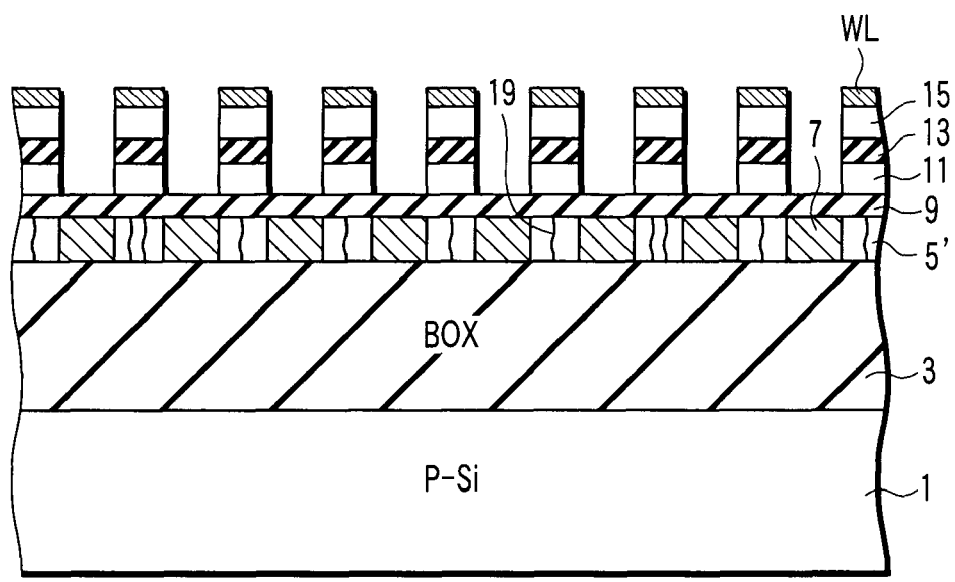
F I G. 21C

NON-VOLATILE SEMICONDUCTOR STORAGE DEVICE AND MANUFACTURING METHOD THEREOF

CROSS-REFERENCE TO RELATED APPLICATIONS

This application is based upon and claims the benefit of priority from prior Japanese Patent Application No. 2006-340201, filed Dec. 18, 2006, the entire contents of which are incorporated herein by reference.

BACKGROUND OF THE INVENTION

1. Field of the Invention

The present invention relates to a non-volatile semiconductor storage device in which a polysilicon SOI layer is used as an active area.

2. Description of the Related Art

A silicon-on-insulator (SOI) substrate must be used to realize a decanano-scale semiconductor device that has been actively developed in recent years. However, since the SOI substrate is expensive, a technology using polysilicon as an SOI layer has been studied (see, e.g., S. S. Bhattacharya, et al., IEEE Trans. ED41, no. 2, pp 221-237, 1994). Although a basic structure of a transistor to be used is very similar to that of a thin film transistor (TFT) used for, e.g., a display, and a TFT for a display panel has been also miniaturized to realize a system-on-panel (SOP). For such circumstances, a miniaturized TFT used in an SOP is getting closer to a decanano-scale semiconductor device using a polysilicon layer. In such a trend, a technology of also using a memory in an SOP has been also studied.

However, the polysilicon has a problem that conduction electrodes are scattered at a grain boundary between grains. A particle diameter of a general silicon grain for this type of application is 100 to 300 nm, and unavoidable unevenness occurs in device characteristics depending on whether a grain boundary between grains is included in a channel region. Further, deterioration of an S-factor (an inverse number of an inclination of a sub-threshold current with respect to a gate voltage) due to miniaturization produces a risk in a device operation itself.

As explained above, a decanano-scale polysilicon SOI device (a non-volatile memory in particular) has a problem of unevenness in characteristics due to a grain boundary of the polysilicon. Therefore, realization of a non-volatile semiconductor storage device and a manufacturing method thereof that suppress unevenness in characteristics due to a grain boundary and have an improved S-factor has been demanded.

BRIEF SUMMARY OF THE INVENTION

According to a first aspect of the invention, there is provided a non-volatile semiconductor storage device, which includes:

a substrate;

a first insulating layer formed on the substrate;

a semiconductor layer formed of polysilicon on the first insulating layer;

a pair of conductor regions formed on the first insulating layer to pass through the semiconductor layer and to sandwich a part of the semiconductor layer, and formed of a metal or a silicide;

a tunnel layer formed on the part of the semiconductor layer sandwiched between the pair of conductor regions;

a charge storage layer formed on the tunnel layer;

a second insulating layer formed on the charge storage layer; and a control gate formed on the second insulating layer.

According to a second aspect of the invention, there is provided a manufacturing method of a non-volatile semiconductor storage device, which includes:

forming an embedded insulating layer on a silicon substrate;

forming a first polysilicon layer on the embedded insulating layer;

depositing a layer of a metal that is one of Ni, Co, W, Ta, Pt, Mo, and Ti on the first polysilicon layer to form a laminated layer;

annealing the laminated layer to form a silicide layer of the metal;

forming a resist mask on the silicide layer, and then etching the silicide layer to form an opening portion from which the embedded insulating layer is exposed;

forming an amorphous silicon layer of a first conductivity type on the embedded insulating layer at the opening portion;

annealing the amorphous silicon layer to form a second polysilicon layer of the first conductive type;

forming a tunnel insulating layer on the second polysilicon layer;

forming a charge storage layer on the tunnel insulating layer;

forming a control gate on the charge storage layer through an interlayer dielectric layer; and removing the resist mask after the forming a control gate, and embedding an interlayer insulating film at a position where the resist mask is removed.

BRIEF DESCRIPTION OF THE SEVERAL VIEWS OF THE DRAWING

FIGS. 3A and 3B are views showing a relationship between the number of grain boundaries and ID-VG characteristics, in which FIG. 3A is a characteristic view when a source/drain is a conventional diffusion layer and FIG. 3B is a characteristic view when a Schottky barrier is provided to the source and the drain (DSS);

FIG. 7A is a top view of a general NAND-type flash memory;

FIG. 7B is an equivalent circuit diagram of FIG. 7A;

FIGS. 8A and 8B are cross-sectional views of a NAND-type flash memory according to a second embodiment, in which FIG. 8A is a cross-sectional view taken along a line 8A-8A in FIG. 7A and FIG. 8B is a cross-sectional view taken along a line 8B-8B;

FIGS. 11 to 15 are cross-sectional views for explaining a manufacturing process of a NAND-type flash memory according to a third embodiment in stages;

FIGS. 16A and 16B are a cross-sectional view and a top view of a step following FIG. 15;

FIGS. 17A and 17B to FIGS. 21A and 21B are cross-sectional views and top views showing steps following FIGS. 16A and 16B in stages;

FIG. 21C is a cross-sectional view cutting across a word line at the step depicted in FIGS. 21A and 21B;

DETAILED DESCRIPTION OF THE INVENTION

Embodiments according to the present invention will now be explained hereinafter with reference to the drawings.

First Embodiment

Figure 1:
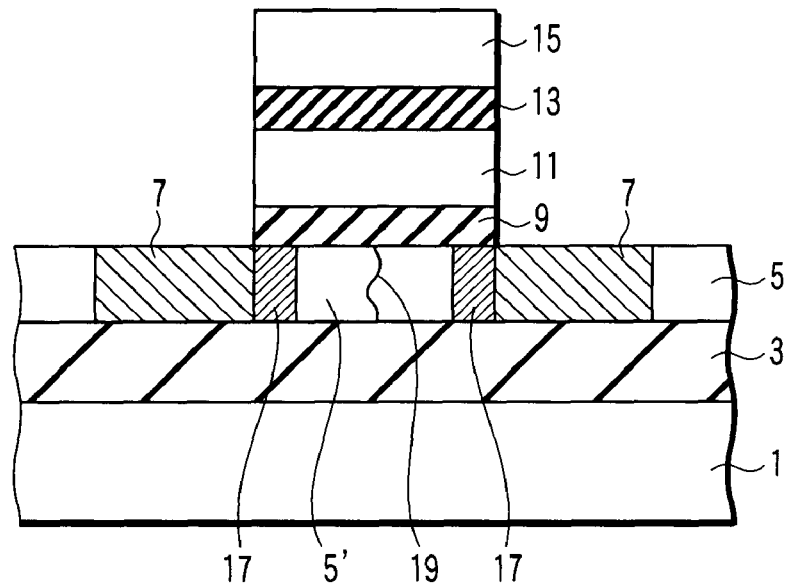
FIG. 1 is a schematic cross-sectional view of a non-volatile memory according to a first embodiment.

FIG. 1 is a schematic cross-sectional view showing a structure of a non-volatile semiconductor storage device according to a first embodiment. An embedded oxide layer (BOX) 3 is formed on a semiconductor substrate 1, and a semiconductor layer 5 made of polysilicon is formed thereon. That is, members denoted by reference numerals 1, 3, and 5 constitute an SOI substrate in which the polysilicon is used for the semiconductor layer.

A pair of conductor regions 7 are formed in the semiconductor layer 5 in such a manner that these regions pass through the semiconductor layer 5 to face each other. The conductor layer 7 is formed of a metal, e.g., Ni, Co, W, Ta, Pt, Mo, Ti, Cu, or Al or a silicide layer in which a metal Ni, Co, W, Ta, Pt, Mo, or Ti is silicided. These conductor regions 7 constitute source and drain regions of a non-volatile memory.

A laminated gate constituted of a charge storage layer 11, an interlayer dielectric 13, and a control gate 15 is formed on a polysilicon semiconductor region 5' sandwiched between the conductor regions 7 through a tunnel insulating layer 9. A silicon oxide layer or a silicon oxynitride layer is used as the tunnel insulating layer 9, and a silicon oxide layer, a silicon nitride layer, a silicon oxynitride layer, a metal oxide thin film layer including at least one of Al, Hf, Zr, and La, or a laminated structure of these layers can constitute the interlayer dielectric 11.

Furthermore, an impurity segregation region 17 is formed on both sides of the polysilicon semiconductor region 5' below the laminated gate, i.e., at boundaries between the polysilicon semiconductor region 5' and the respective conductor regions 7. Moreover, there is a high possibility that a grain boundary 19 of the polysilicon is included in the polysilicon semiconductor region 5'. The number of the grain boundary is not limited to one, and no grain boundary may exist.

In this embodiment, a gate length of the charge storage layer 11 having the above-explained structure is set to 30 nm or below, and ballistic transport is utilized to suppress unevenness in an on-current and unevenness in Vth caused due to grain boundary scattering. A function that acquires such an effect will now be explained hereinafter.

Figure 2:
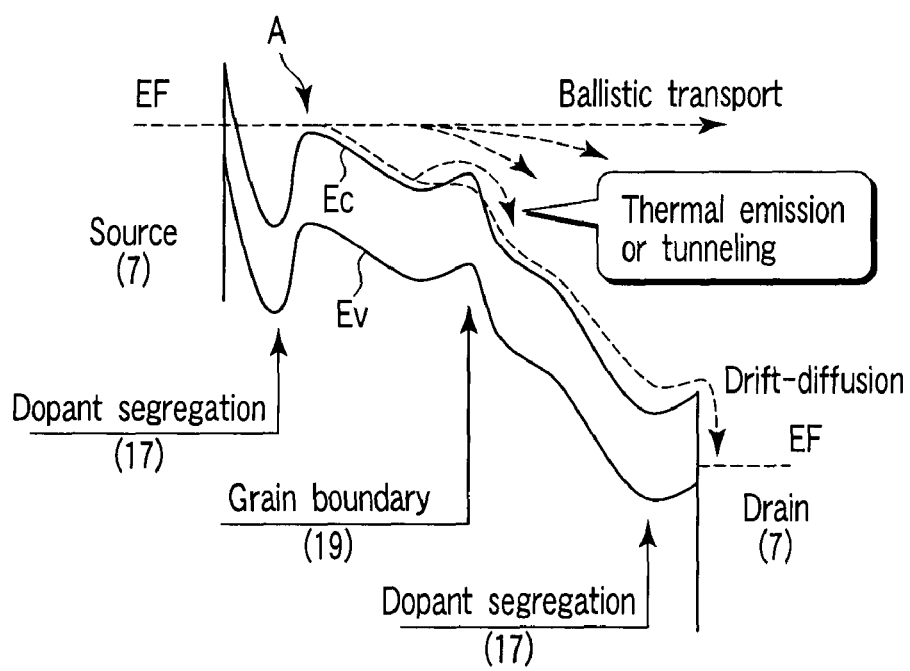
FIG. 2 is a schematic view showing a relationship between ballistic transport and grain boundary scattering in an energy band chart.

FIG. 2 is a schematic view showing a relationship between ballistic transport and grain boundary scattering in an energy band chart. Outer sides of right and left vertical lines are a source and a drain and correspond to the right and left conductor layers 7. Therefore, each interface with respect to the semiconductor region 5' is a Schottky junction. When the gate length is sufficiently long as compared with a mean free path of electrons, application of a voltage to a space between the source and the drain enables electrons to drift along a conduction band. When there is a barrier based on the grain boundary 19, thermal emission or tunneling enables the electrons to be transmitted through the barrier. Conversely, when the gate length is sufficiently shorter than a mean free path of the electrons, conduction of the electrons becomes linear, thereby shifting to ballistic transport. Therefore, assuming that the mean free path is fixed, the gate length becomes short, and ballistic transport becomes more dominant. It is to be noted that a drop of a band near the interface with respect to the source/drain occurs due to an influence of the impurity segregation region 17. Based on this drop, a wall thickness of the Schottky barrier on the interface with respect to the source/drain is reduced, and the number of the electrons that enter the channel region is increased. Here, when a Fermi energy level ($E_F$) becomes higher than a barrier indicated by an arrow A, the number of the electrons that provoke ballistic transport is exponentially increased. This barrier indicated by the arrow A can be reduced by using a gate voltage, and hence a current based on ballistic transport is increased together with the gate voltage.

Figure 3A:
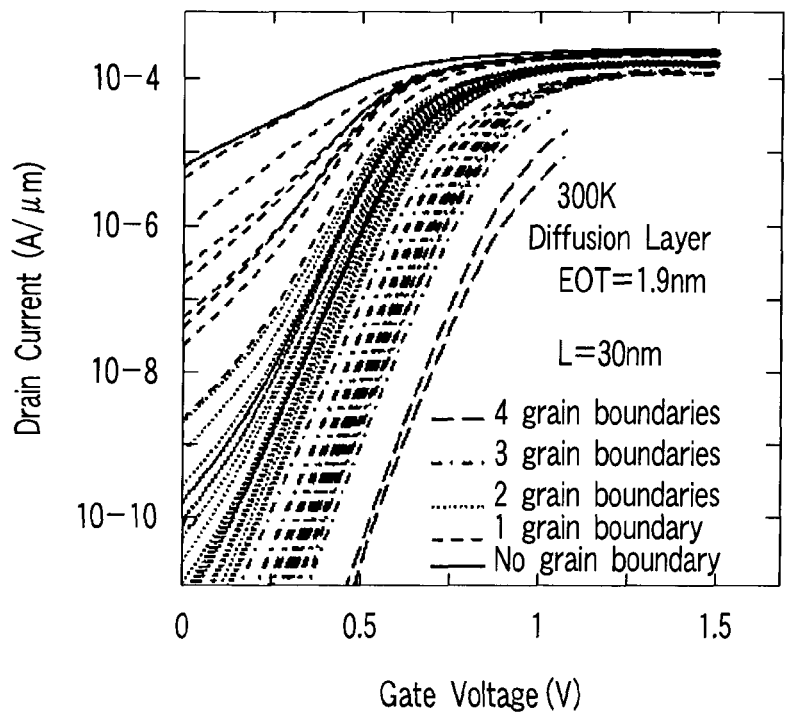

An influence of ballistic transport on ID-VG characteristics will now be explained. FIG. 3A is a simulation chart showing a relationship between a gate voltage and a drain current (ID-VD characteristics) when the Schottky barrier based on the impurity segregation region (a dopant segregation Schottky [DSS] structure) is not present in a regular crystalline SOI substrate. As explained above, since the DSS is not present, ballistic transport hardly occurs. A solid line indicates a case where a grain boundary is not present, and a dotted line or a broken line indicates a case where the number of the grain boundaries is one to four. It can be understood that a leakage current is reduced in an off-current region when the number of the grain boundaries is increased. It can be considered that the leakage current varies even though the number of the grain boundaries is unchanged because of a position of each grain boundary in the channel. As explained above, it can be understood that unevenness in device characteristics caused due to a position of each grain boundary in the channel region or the number of the grain boundaries below the gate is large.

Figure 3B:
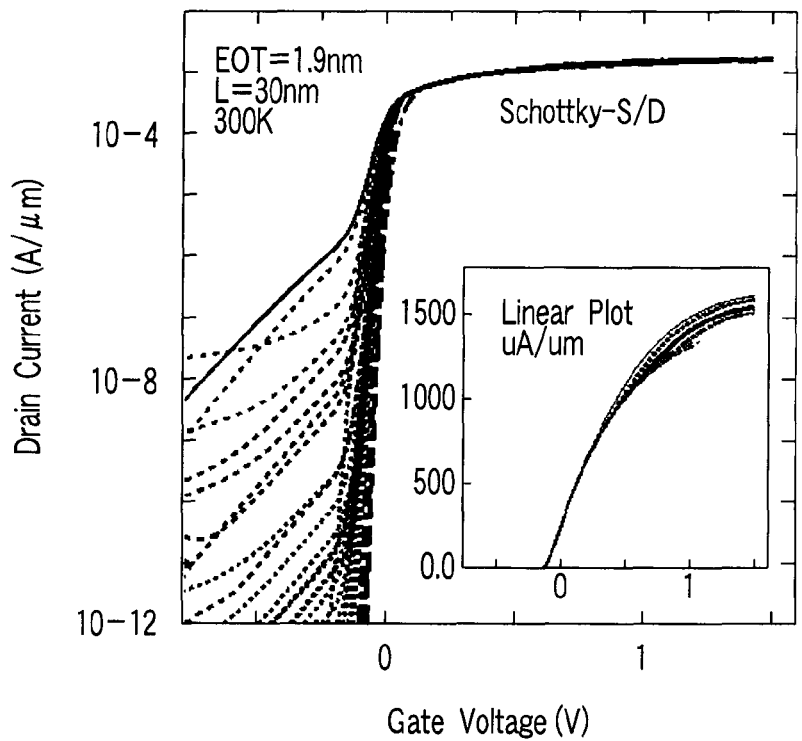

FIG. 3B shows a result of simulating ID-VG characteristics when a Schottky barrier (DSS) based on an impurity segregation region is provided. As explained above, ballistic transport is apt to occur when the DSS is present. When VG=0V or above, such unevenness as shown in FIG. 3A is eliminated. This means that ballistic transport is dominant in a high-electric-field region (an on-current region) and unevenness in device characteristics due to grain boundary scattering is suppressed. When the DSS is provided in this manner, a drain current has an order of $10^{-5}$ A/$\mu$m, and the drain current that is approximately one order of magnitude more than that when the DSS is not provided (i.e., the example shown in FIG. 3A where a drain current has an order of $10^{-4}$ A/$\mu$m) can be obtained.

On the other hand, in a region where VG=0V or below, unevenness in grain boundaries can be still considerably observed in a leakage current when off. However, like the example shown in FIG. 3A, the leakage current when off, when the gain boundaries are present, is lower than that when the grain boundaries are absent, and it can be understood that the S-factor can be reduced.

The first embodiment has properties of both the above regions, and it is preferable that the gate length is set to 30 nm or below and at least one grain boundary is formed in the channel. First, grain boundary scattering can be utilized in an off-current region to reduce an off-current, thereby improving the S-factor. In the on-current region, the ballistic transport can be utilized to suppress unevenness in grain boundaries. It is to be noted that, although particulars will be explained in conjunction with a third embodiment, forming the conductor regions 7 first and growing a polysilicon layer between these regions enables growth of polysilicon including at least one grain boundary.

Figure 4:
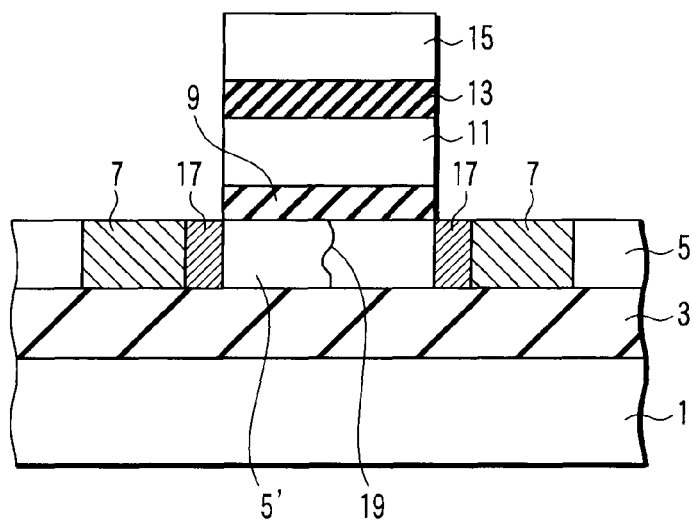
FIG. 4 is a cross-sectional view showing a modification of the first embodiment.

It is to be noted that each impurity segregation region 17 is formed immediately below the charge storage layer 11 in FIG. 1, but it may be formed on an outer side apart from a side surface of the charge storage layer as shown in FIG. 4. Since a large on-current can be drawn when the gate length is 20 to 30 nm, the embodiment shown in FIG. 1 is good. However, when the gate length is 10 to 20 nm, the embodiment shown in FIG. 4 is better in order to assure the channel region.

Figure 5:
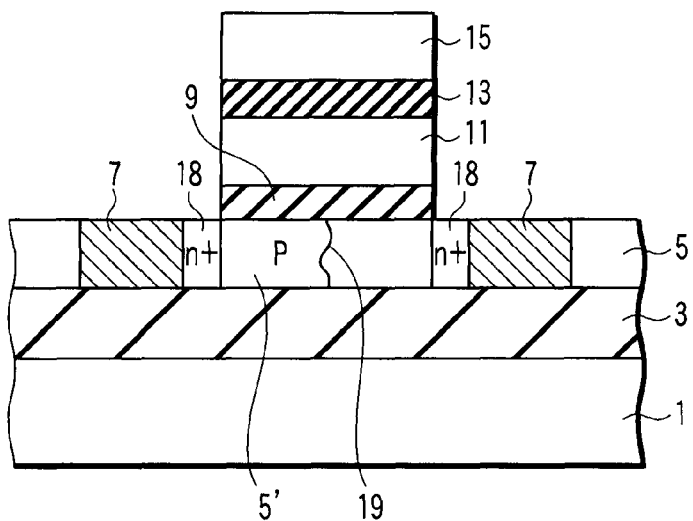
FIG. 5 is a cross-sectional view showing another modification of the first embodiment.
Figure 6:
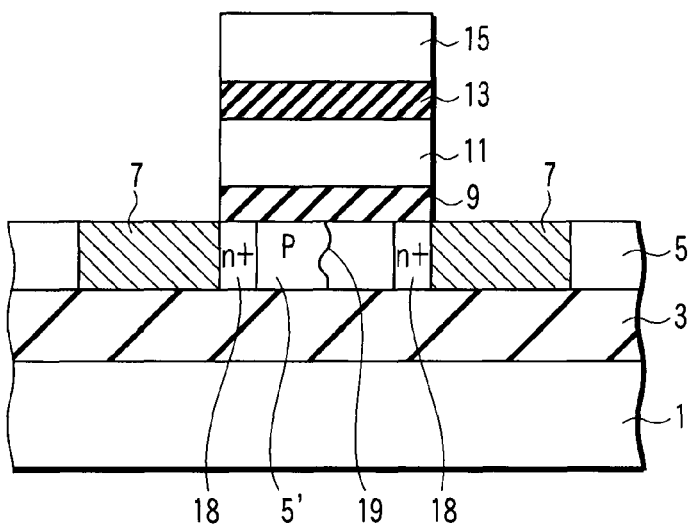
FIG. 6 is a cross-sectional view of still another modification of the first embodiment.

Additionally, as shown in FIG. 5, a semiconductor region 18 having a polarity opposite to that of the channel region 5' may be formed between the channel region 5' and each conductor layer 7. In the example depicted in FIG. 5, the channel region 5' is a p-type region and the semiconductor region 18 is of an $n^+$ type. Further, as shown in FIG. 6, this semiconductor region 18 may be formed to enter a space below the charge storage layer 11. FIG. 2 is a schematic energy band chart of a Schottky junction having these impurity segregation regions.

As explained above, according to the first embodiment, unevenness in characteristics of the non-volatile memory using the polysilicon SOI layer due to grain boundaries can be suppressed, thereby realizing a reduction in the S-factor.

Second Embodiment

According to a second embodiment, an example where the non-volatile semiconductor storage device according to the first embodiment is applied to a so-called NAND-type memory in which a plurality of memories are connected in series like a string in such a manner that the memories adjacent to each other share a conductor region 7 will be explained.

As shown in an equivalent circuit diagram of FIG. 7B, in a NAND-type memory, a plurality of laminated gate type non-volatile memories are connected in series in such a manner that the memories adjacent to each other share one of a source and a drain. Selective transistors Q1 and Q2 are arranged at both ends of the laminated gate type non-volatile memories connected in series, on end of a source/drain of Q1 is connected with a bit line BL, and one end of a source/drain of Q2 is connected with a source line SL. FIG. 7A is a schematic top view of this NAND string.

Figure 8A:
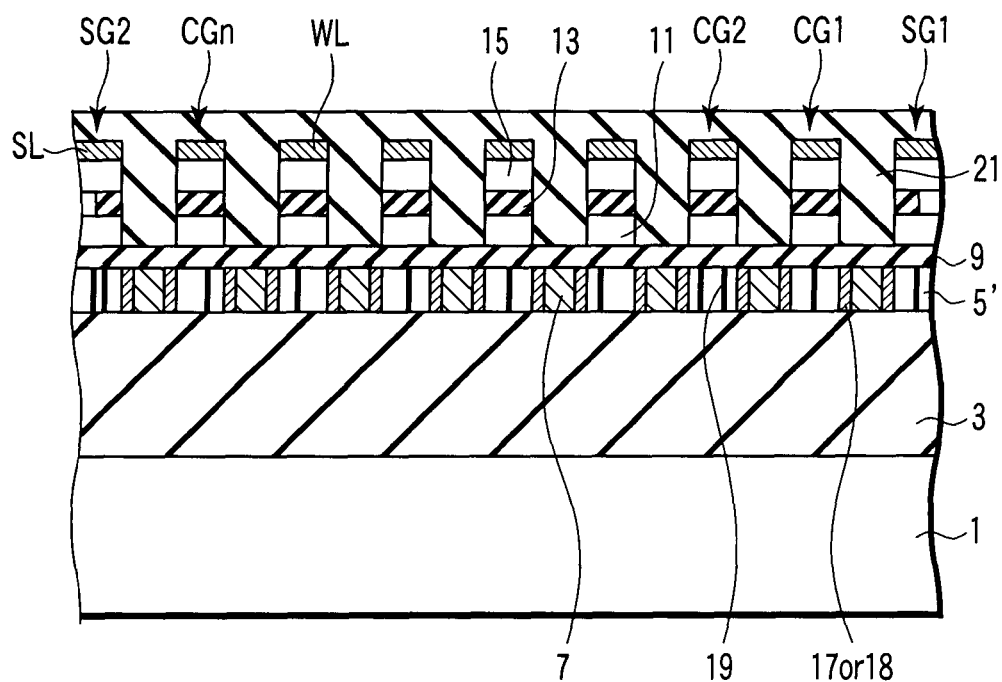
Figure 8B:
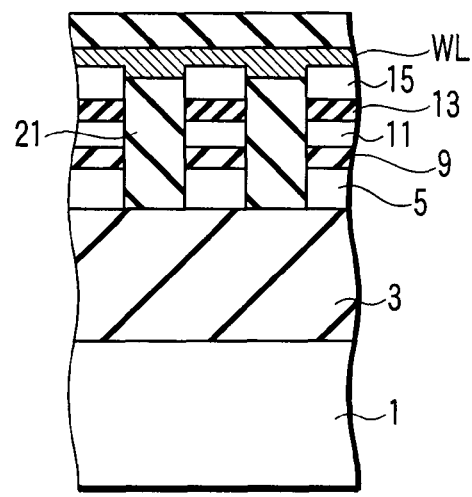

FIG. 8 are views showing an example where the non-volatile memory (FIG. 4) according to the first embodiment is applied to the NAND string, in which FIG. 8A corresponds to a cross-sectional view taken along a line 8A-8A in FIG. 7A (however, the selective transistors are partially shown) and FIG. 8B corresponds to a cross-sectional view taken along a line 8B-8B in FIG. 7A.

A channel region 5' made of polysilicon and a conductor region (a source/drain region) 7 are alternately formed on an embedded insulating layer 3 formed on a silicon substrate 1. After a tunnel insulating layer 9 is formed on one surface, a charge storage layer 11, an interlayer dielectric 13, and a control gate 15 are sequentially formed on the channel region 5'. An interlayer insulating layer 21 is embedded at each position where the charge storage layer 11 and the control gate 15 are absent. Further, an impurity segregation region 17 where a dopant impurity segregates is formed at both ends of the conductor regions 7, thereby forming a DSS structure. Providing a Schottky junction in this manner enables exercising an ingenuity to suppress occurrence of ballistic transport. Furthermore, as shown in FIG. 8B, the interlayer insulating layer 21 is also embedded between the NAND strings.

This structure is characterized in that a gate length is set to 10 nm or above enabling assuring a channel length and 30 nm or below allowing ballistic transport to become dominant, and unevenness in device characteristics due to grain boundaries (unevenness in grain boundaries) can be suppressed. Moreover, it is also characterized in that a particle diameter of the silicon-grain is shorter than the gate length, and hence at least one grain boundary is present in a channel region in almost all bits. Therefore, a leakage current when off can be reduced.

The conductor region 7 is formed of a metal, e.g., Ni, Co, W, Ta, Pt, Mo, Ti, Cu, or Al, or a silicide layer of, e.g., Ni, Co, W, Pt, Mo, or Ti. Higher advantage is obtained when the conductor region 7 is fully silicided.

Figure 9:
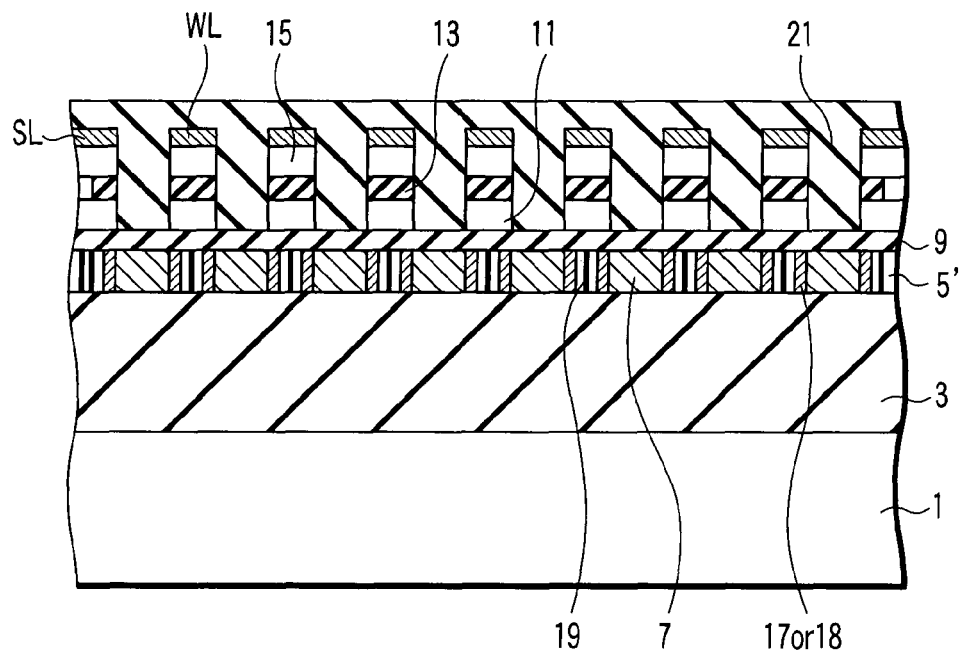
FIG. 9 is a cross-sectional view according to a modification of the second embodiment.

FIG. 9 shows a modification of FIG. 8A having a structure where each impurity segregation region 17 enters a space below the charge storage layer 11. This corresponds to a structure where the plurality of devices depicted in FIG. 1 are connected in series. This is a structure suitable when a gate length is 20 to 30 nm.

Figure 10:
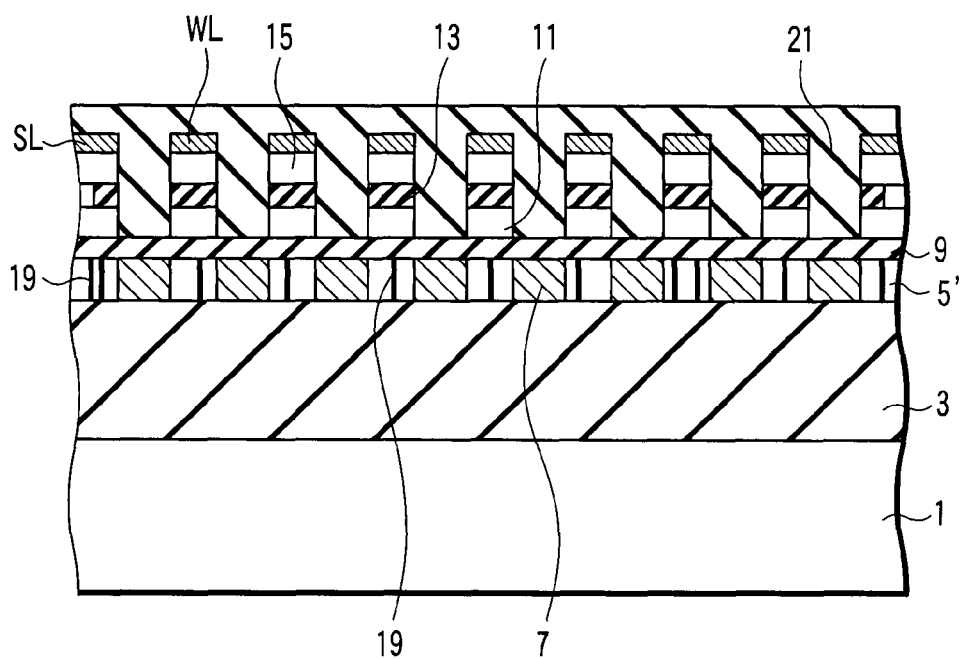
FIG. 10 is a cross-sectional view according to another modification of the second embodiment.

FIG. 10 also shows a modification of FIG. 8A in which each impurity segregation region 17 is eliminated. Although ballistic transport relatively hardly occurs, an effect of ballistic transport can be obtained to some extent if a gate length is 30 nm or below.

As explained above, the non-volatile memory according to the first embodiment is applied to the NAND-type memory cell, the gate length is set to 30 nm or below, and at least one grain boundary is formed in the channel. As a result, grain boundary scattering can be utilized in an off-current region to reduce a leakage current when off, thereby improving the S-factor. Additionally, the ballistic transport can be utilized in an on-current region to suppress an increase in the on-current and grain boundary unevenness in device characteristics.

In the second embodiment, the NAND flash is taken as an example. However, the same effect can be obtained in a semiconductor device (e.g., an NOR or a CMOS) other than the NAND flash if the gate length is 30 nm or below, the polysilicon SOI layer is sandwiched between the conductor regions, and an average particle diameter in the polysilicon layer as a channel portion is less than the gate length.

Third Embodiment

Figure 11:
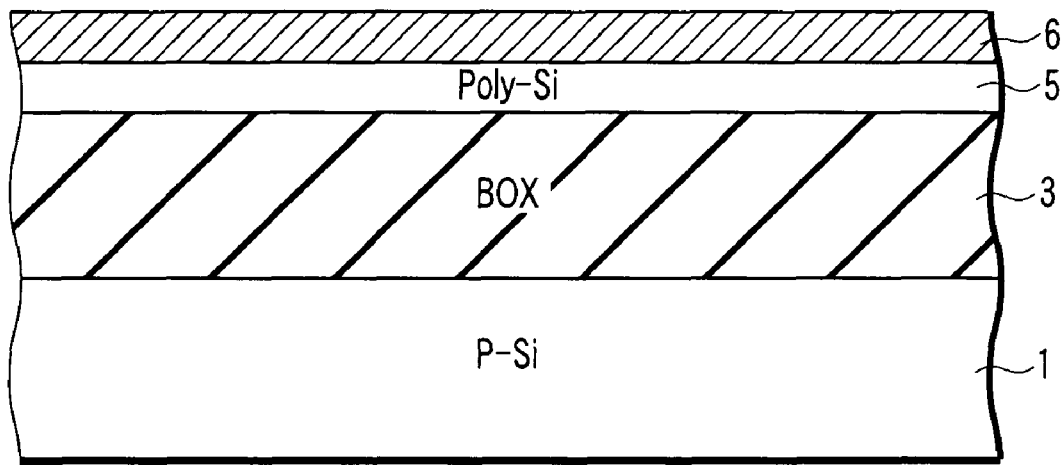

According to a third embodiment, a manufacturing method of the device depicted in FIG. 9 according to the second embodiment will be explained. First, as shown in FIG. 11, an embedded (buried) oxide layer (BOX) 3 is formed on, e.g., a p-type silicon substrate 1 by using $SiO_2$ based on a known method. For example, a p-type polysilicon layer is deposited on this embedded oxide layer 3, and an Ni layer 6 is further deposited thereon. This structure is annealed at, e.g., 400° C. to form an NiSi layer 7 that is one type of a silicide layer from polysilicon and Ni (see FIG. 12). At this time, a layer thickness of Ni and an annealing temperature are adjusted so that siliciding is finished on an interface.

Here, Co or W may be used in place of Ni. The silicide layer containing $CoSi_2$ can be formed if Co is used, and the silicide layer containing WSi can be formed if W is adopted. In this manner, as raw materials of the FUSI layer, there are many materials, e.g., Co, W, Ta, Pt, Mo, or Ti besides Ni. It is sufficient to select a convenient one from these materials in accordance with process conditions or desired device characteristics.

Figure 13:
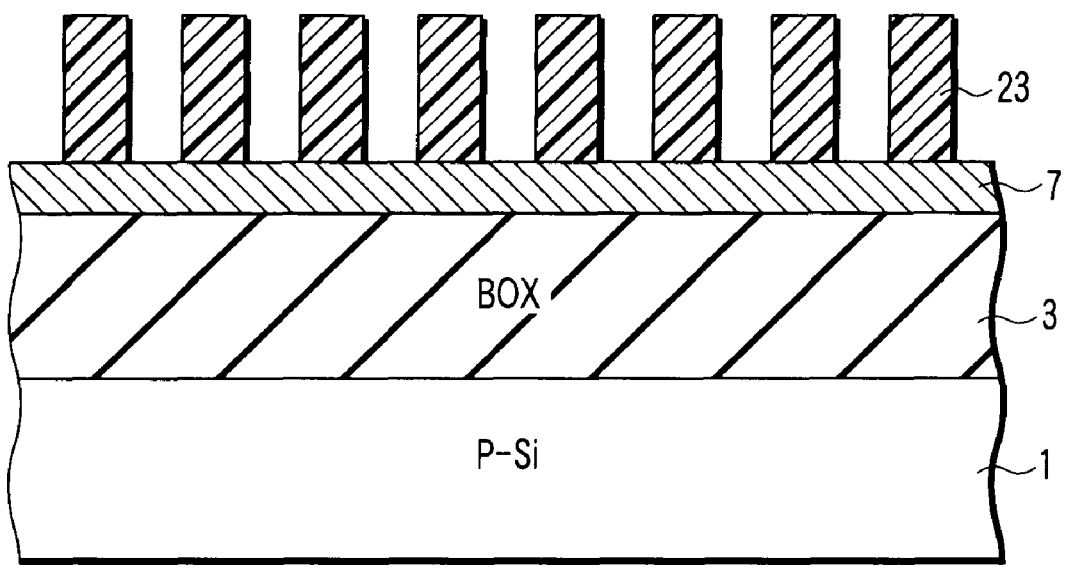
Figure 14:
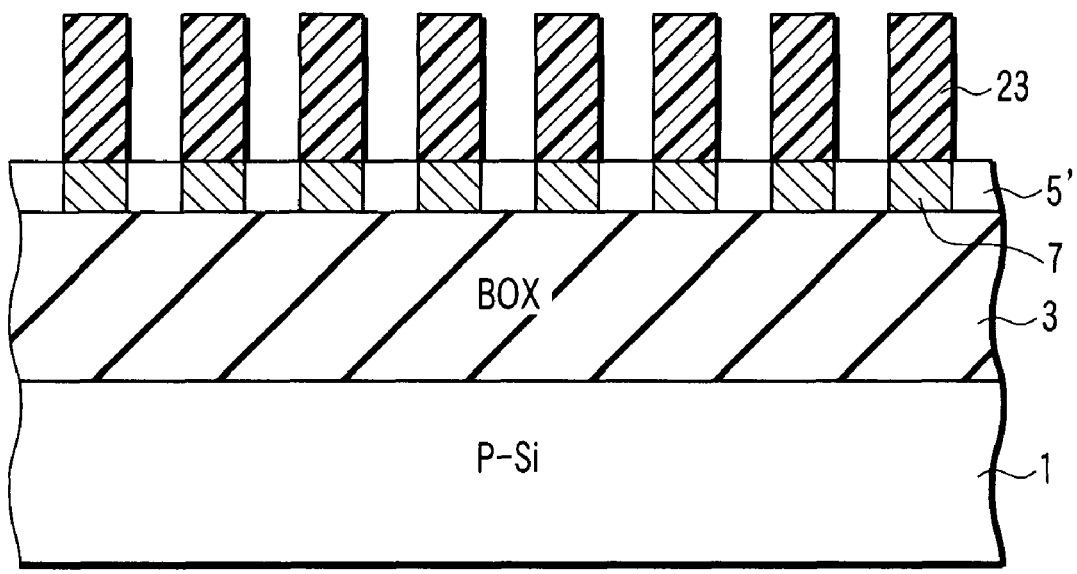

Subsequently, a silicide surface is flattened to uniform a layer thickness, thereby obtaining a desired thickness. A resist mask 23 is formed on the flattened surface (see FIG. 13). A width of the resist mask 23 is set to 30 nm or below. As a forming method of the resist mask, using, e.g., a fine pitch photoresist method or a dummy gate sidewall leaving method enables forming the mask at a fine pitch. This mask 23 is used to etch the silicide layer 7, and amorphous silicon is deposited on this layer by, e.g., the CVD method at 550° C. Then, annealing is performed at a low temperature, e.g., approximately 600° C., thereby forming a polysilicon layer 5' (see FIG. 14).

Here, an important thing is that a distance between parts of the resist mask 23 adjacent to each other is a gate length. Further, when amorphous silicon embedded between the parts of the resist mask 23 is annealed, a particle diameter of the silicon-grain in layer 5' formed here is always less than the gate length. This is one of the most important characteristics in this embodiment.

Then, as shown in FIG. 15, the resist mask 23 is utilized to sequentially embed a tunnel insulating layer 9 formed of, e.g., a silicon oxynitride layer, a charge storage layer 11 made of polysilicon, an interlayer dielectric 13 formed of a high-dielectric-constant insulating layer made of $LaAlO_2$, $Al_2O_3$, or HfSiON, a silicon oxide layer, a silicon oxynitride layer, a silicon nitride layer, or laminated layer of these layers, a control gate 15 formed of polysilicon or silicide, and a cap layer 25 formed of a silicon oxide layer between the parts of the resist mask 23.

A process of forming WL will now be explained. FIG. 16B is a top view showing that a second resist mask 27 is formed on a top surface depicted in FIG. 15 in such a manner that it crosses the resist mask 23. FIG. 16A is a cross-sectional view taken along a line 16A-16A depicted in FIG. 16B.

Subsequently, as shown in FIGS. 17A and 17B, shallow trench isolation (STI) grooves are formed to reach the oxide layer 3. FIG. 17B is a top view, and FIG. 17A is a cross-sectional view taken along a line 17A-17A in FIG. 17B. Then, as shown in FIGS. 18A and 18B, each STI is filled with a silicon oxide layer 29 and a silicon nitride layer 31. FIG. 18B is a top view, and FIG. 18A is a cross-sectional view taken along a line 18A-18A in FIG. 18B.

Thereafter, as shown in FIGS. 19A and 19B, reactive ion etching (RIE) is performed to remove the resist mask 27, and then hydrofluoric acid is used to perform a treatment so that the polysilicon formed as the control gate 15 is exposed. FIG. 19B is a top view, and FIG. 19A is a cross-sectional view taken along a line 19A-19A in FIG. 19B.

Subsequently, hot phosphoric acid is used to remove the silicon nitride layer 31, and then W, Mo, Pt, Al, Cu, CoSi2, WSi, or NiSi is deposited on the entire surface to form each word line WL based on photolithography (see FIGS. 20A and 20B). FIG. 20B is a top view, and FIG. 20A is a cross-sectional view taken along a line 20A-20A in FIG. 20B. Since an upper part of each STI is capped with the silicon nitride layer 31, each word line WL can be prevented from coming into contact with the interlayer dielectric 13.

Then, as shown in FIGS. 21A and 21B, the resist mask 23 is removed. FIG. 21A is a cross-sectional view taken along a line 21A-21A in FIG. 21B, and FIG. 21C is a cross-sectional view taken along a line 21C-21C in the same. When an impurity segregation (DSS) layer is not formed, an interlayer insulating layer 21 is embedded as it is to form each bit line BL. As a result, the structure depicted in FIG. 10 is brought to completion.

In case of forming the DSS layer, when a p-type impurity is doped to perform annealing, each impurity segregation layer 17 having a lateral width of approximately 2 nm is formed. When an n-type impurity is doped to perform annealing, each impurity segregation layer 18 having a lateral width of approximately 2 nm is formed (see FIG. 9). Then, each space between the laminated gates is filled with the interlayer insulating layer 21, e.g., a silicon oxide layer. In this case, as shown in FIG. 9, each DSS layer 17 or 18 enters a space below the gate.

Figure 22A:
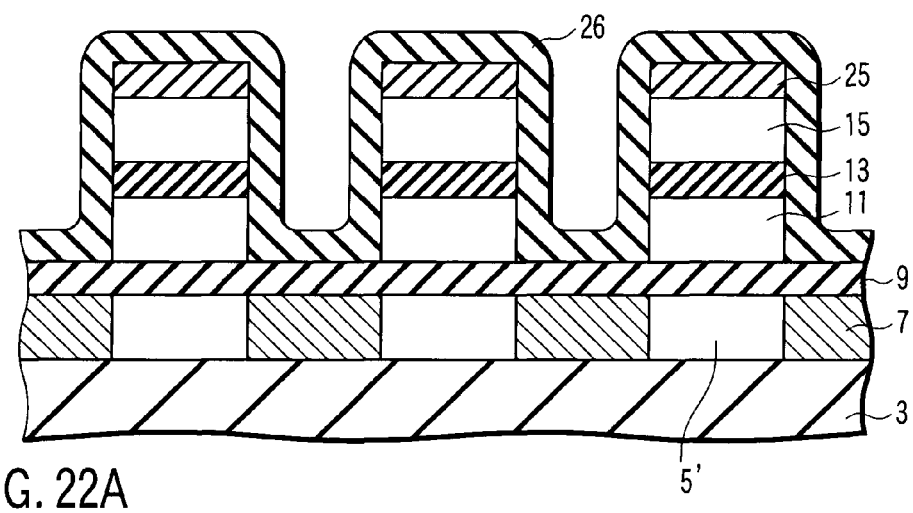
FIGS. 22A to 22C are cross-sectional views for explaining a method of forming a side wall insulating layer on a laminated gate to change a forming position of an impurity segregation region or a reverse polarity region in stages.
Figure 22B:
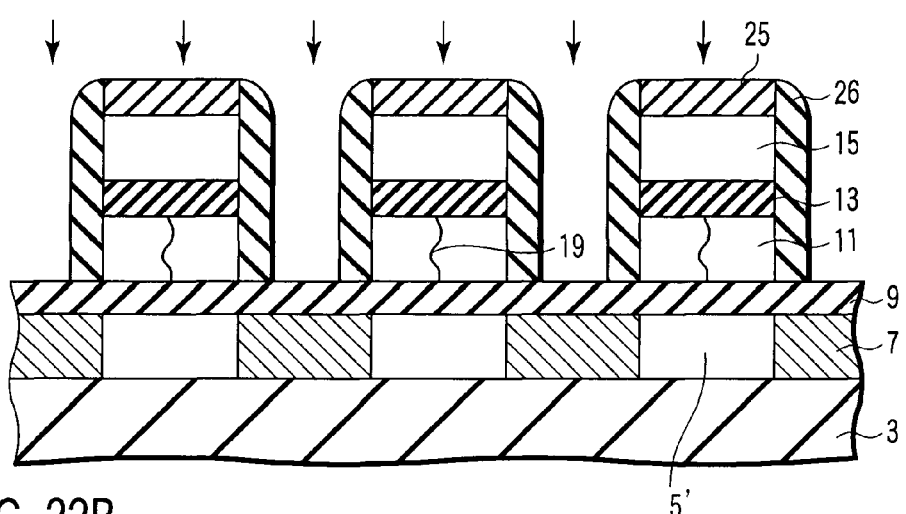
Figure 22C:
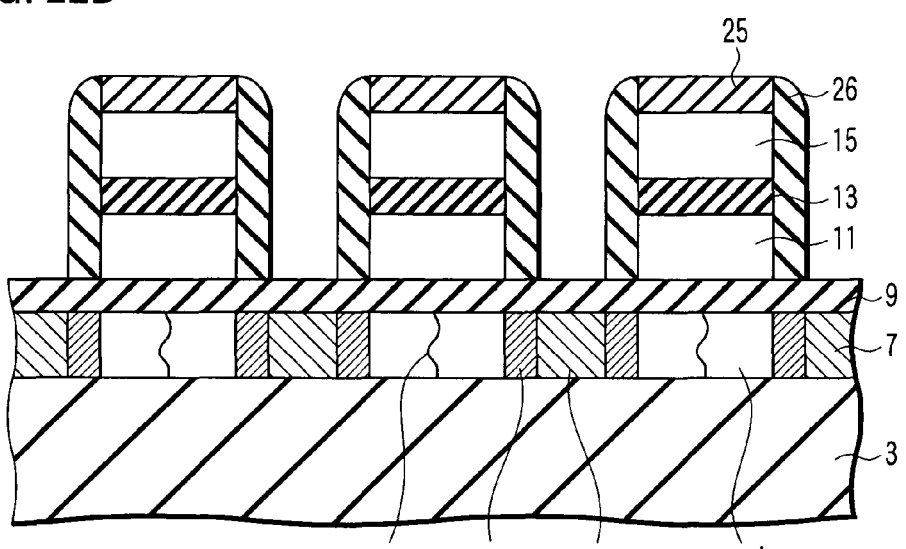

Further, as shown in FIGS. 22A to 22C, when each sidewall insulating layer 26 is provided to the laminated gate and then an impurity is doped to perform annealing, a structure in which each DSS 17 or 18 does not enter a space below the gate is brought to completion as shown in FIG. 8A.

That is, as shown in FIG. 22A, a surface of the laminated gate structure is lined with the silicon oxide layer 26 having a thickness of, e.g., approximately 2 nm, and then RIE or the like is performed to leave each sidewall insulating layer 26. Subsequently, when an impurity ion is implanted to perform annealing, the impurity segregation layer 17 is formed. It is needless to say that the space between the laminate gates is then filled with the interlayer insulating layer 21.

Although the impurity having the same polarity as that of the polysilicon layer is doped in the above example, when a high-concentration impurity having a reverse polarity (e.g., an n type) is doped after providing each sidewall insulating layer to each laminated gate, each reverse polarity region 18 is formed. That is, a NAND string in which the non-volatile memories depicted in FIG. 5 or 6 are connected in series can be formed.

As explained above, according to the third embodiment, the plurality of conductor regions 7 are aligned and formed, then, the channel region 5 made of the polysilicon is grown in the space which is 30 nm or below sandwiched between the conductor regions 7, and at least one grain boundary is formed in the channel. Therefore, there can be formed the NAND-type flash memory that can utilize grain boundary scattering in the off-current region to reduce the off-current, and utilize the ballistic transport in the on-current region to suppress grain boundary unevenness in device characteristics and increase the on-current while improving the S-factor.

Fourth Embodiment

Figure 23A:
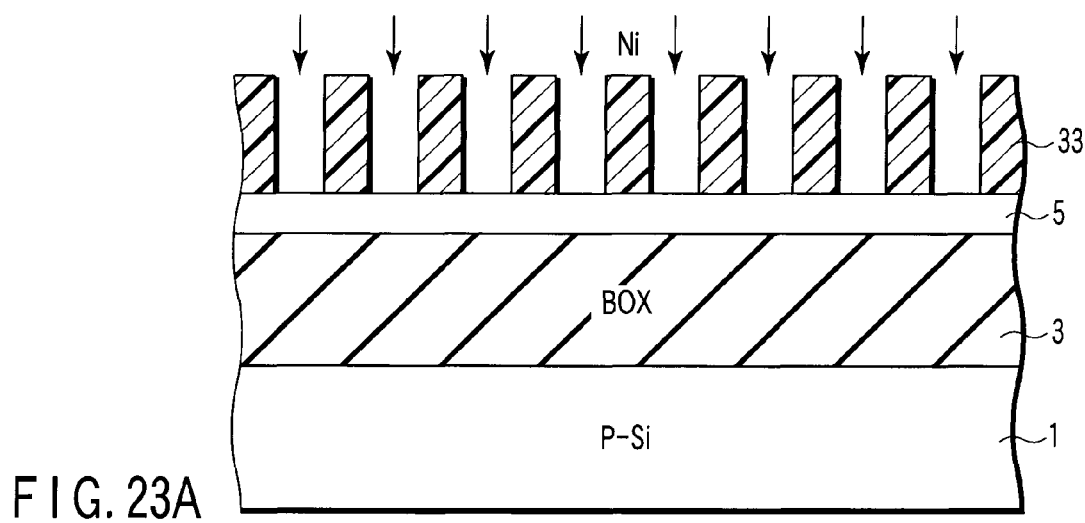
FIGS. 23A to 23F are cross-sectional views for explaining a manufacturing method of a NAND-type flash memory according to a fourth embodiment in stages.
Figure 23B:
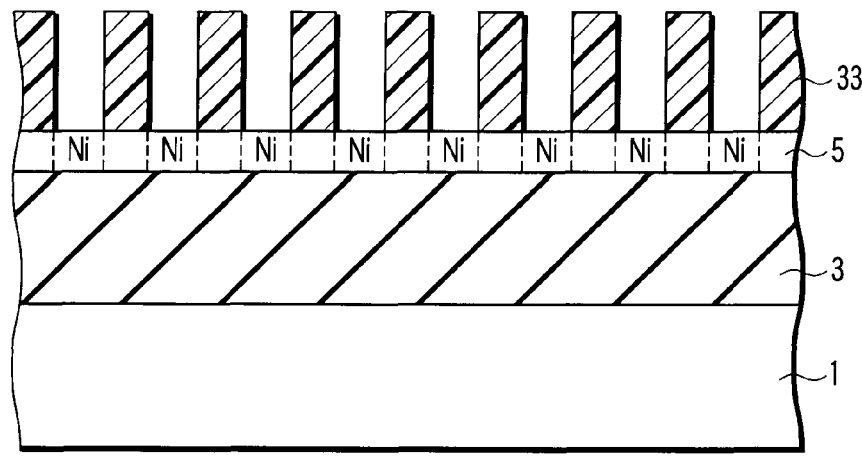

A fourth embodiment relates to a different manufacturing method of the device depicted in FIG. 9 according to the second embodiment. First, as shown in FIG. 23A, an embedded silicon oxide layer 3, a (n-type containing, e.g., phosphor [P]) polysilicon layer 5, and a resist mask 33 are sequentially formed on a silicon substrate 1. A thickness of the polysilicon layer 5 is 10 to 30 nm, a width (an opening portion) of the resist mask 33 is also 10 to 30 nm. Subsequently, Ni is ion-implanted from a top surface of the substrate so that Ni is selected implanted into the polysilicon layer 5 (FIG. 23B).

Figure 23C:
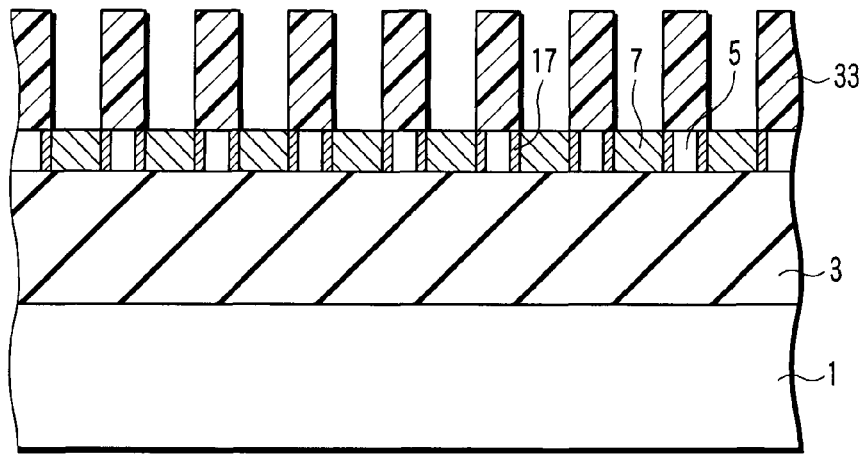

Then, when annealing is performed, siliciding advances in the polysilicon layer 5 corresponding to each mask opening portion, thereby forming NiSi as each conductor region 7. At this time, since coupling of Ni and Si is strong, P as an impurity is pushed toward both side surfaces of each NiSi region, thereby forming each impurity segregation region 17 (FIG. 23C).

Figure 23D:
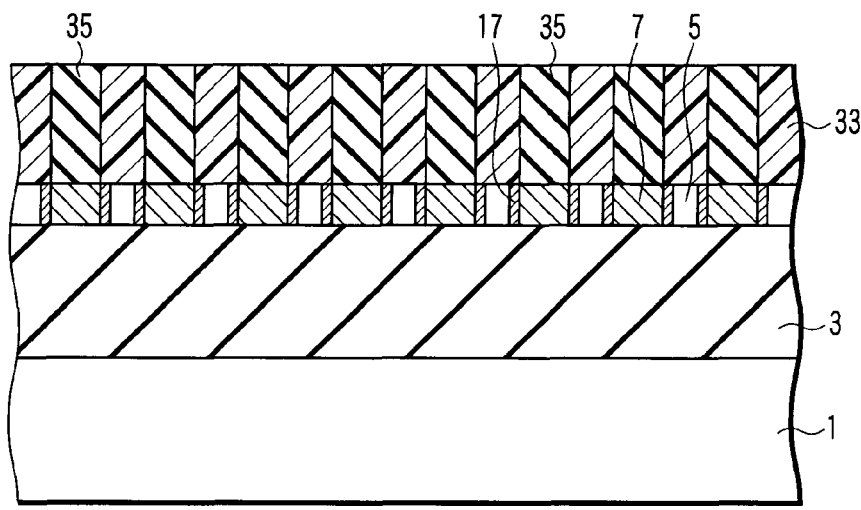

Then, an interlayer insulating layer 35 is embedded between parts of the resist mask 33, and the surface is flattened by, e.g., CMP (FIG. 23D). Thereafter, the resist mask 33 is removed by, e.g., RIE to leave the interlayer insulating layer 35 (FIG. 23E).

Subsequently, sidewall insulating layers 37 are formed to protect respective impurity segregation regions 17. Next, the polysilicon layer 5 sandwiched between the conductor regions 7 is removed by the same method as that depicted in FIG. 14 according to the third embodiment. Then, for example, an n-type polysilicon region 5' is newly embedded, and each impurity segregation region 17 is left as it is. Thereafter, the sidewall insulating layers 37 are removed.

Figure 23E:
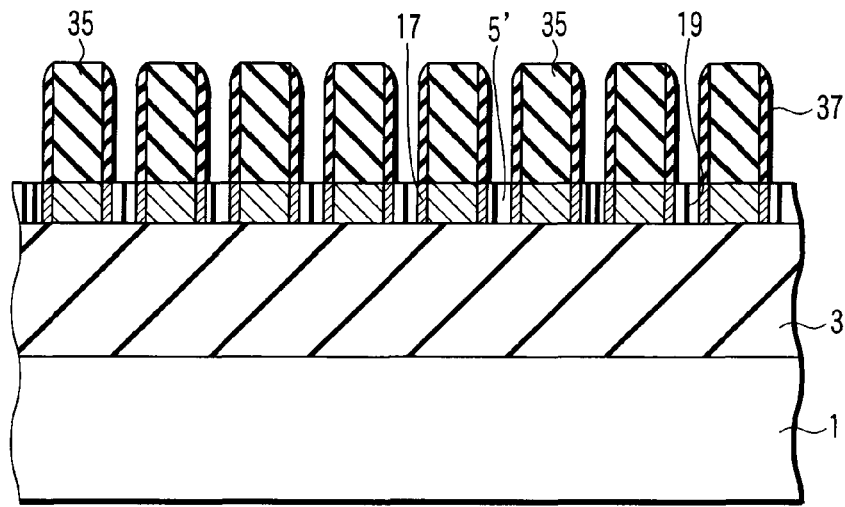
Figure 23F:
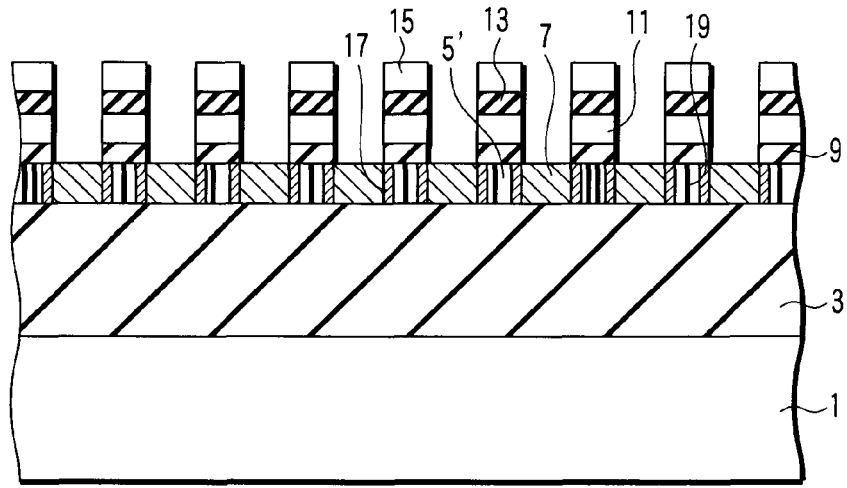

Since the polysilicon region 5' grows while being sandwiched between the conductor regions 7 adjacent to each other, thereby forming each grain boundary 19 (FIG. 23E). A tunnel insulating layer 9 and laminated gates 11, 13, and 15 are formed thereon like the third embodiment (FIG. 23F).

Further, there is also a method of clearing the impurity segregation regions 17 without forming the sidewall insulating layers 37. In this case, the structure depicted in FIG. 10 is formed. When the polysilicon layer 5' that is newly embedded is of a p type, the structure depicted in FIG. 6 is formed. Furthermore, a second resist mask 35 different from the resist mask 33 can be used in place of the interlayer insulating layer 35.

Subsequent steps are the same as those depicted in FIGS. 17A and 17B and the subsequent drawings according to the third embodiment, thereby omitting a tautological explanation. According to the fourth embodiment, the device depicted in FIG. 9 can be formed at the simpler steps than those in the third embodiment.

(Modification)

Figure 12:
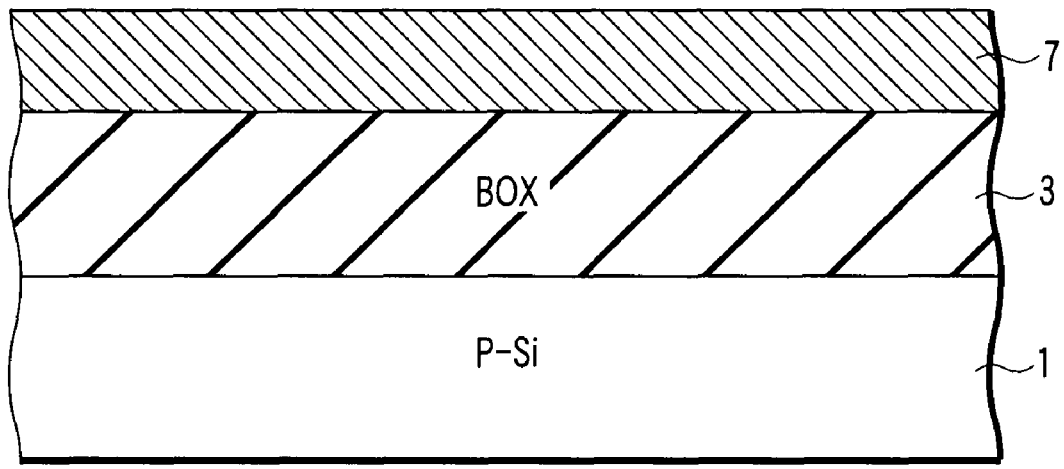

Although the example where a metal silicide is formed as each conductor region 7 has been explained in the third and fourth embodiments, 5 and 6 in FIG. 11 or 7 in FIG. 12 according to the third embodiment are constituted of a single metal, and then the same steps as those in the third embodiment are carried out, for example. Then, a NAND string having a metal conductor layer 7 can be formed. In this case, as the metal, Ni, Co, W, Ta, Pt, Mo, Ti, Cu, Al, or Au can be used.

Moreover, as the silicide used for the conductor region 7 or the word line WL explained in the foregoing embodiments, a silicide of, e.g., V, Cr, Mn, Y, Rn, Hf, Ir, Er, Pd, Zr, Gd, Dy, Ho, or Er as well as $NiSi_x$ ($0<x<1$) can be used as long as it demonstrates metallic electrical conduction properties.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor storage device comprising:
    a substrate;
    a first insulating layer formed on the substrate;
    a semiconductor layer formed of polysilicon on the first insulating layer;
    a pair of conductor regions formed on the first insulating layer to pass through the semiconductor layer and to sandwich a part of the semiconductor layer which includes a channel region, and formed of a metal or a silicide;
    a tunnel layer formed on the part of the semiconductor layer sandwiched between the pair of conductor regions;
    a charge storage layer formed on the tunnel layer;
    a second insulating layer formed on the charge storage layer; and
    a control gate formed on the second insulating layer,
    wherein an average particle diameter of silicon-grains forming the semiconductor layer below the charge storage layer is less than a length of the charge storage layer in a direction along which the pair of conductor regions face each other, and the channel region includes at least one grain boundary intercepting a current path of the channel region.

2. The device according to claim 1,
    wherein a length of the charge storage layer is equal to or less than 30 nm.

3. The device according to claim 1, further comprising a pair of impurity regions which are interposed between the pair of conductor regions and the semiconductor region below the charge storage layer and in which an impurity having the same polarity as that of the semiconductor region is dosed.

4. The device according to claim 1, further comprising a pair of impurity regions which are interposed between the pair of conductor regions and the semiconductor region below the charge storage layer and in which an impurity having a polarity opposite to that of the semiconductor region is dosed.

5. The device according to claim 1,
    wherein the metal forming the pair of conductor regions contains at least one selected from the group consisting of Ni, Co, W, Ta, Pt, Mo, Ti, Cu, and Al.

6. The device according to claim 1,
    wherein the silicide forming the pair of conductor regions contains at least one selected from the group consisting of Ni, Co, W, Ta, Pt, Mo, and Ti.

7. A non-volatile semiconductor storage device having a NAND structure which includes a plurality of elements each of which is constituted of the non-volatile semiconductor storage device according to claim 1, and in which the plurality of elements are connected in series in a string form in such a manner that the elements adjacent to each other share one of the pair of conductor regions.

8. A non-volatile semiconductor storage device comprising:
    a substrate;
    a first insulating layer formed on the substrate;
    a semiconductor layer formed of polysilicon on the first insulating layer;
    a pair of conductor regions formed on the first insulating layer to pass through the semiconductor layer and to sandwich a part of the semiconductor layer, and formed of a metal or a silicide;
    a tunnel layer formed on the part of the semiconductor layer sandwiched between the pair of conductor regions;
    a charge storage layer formed on the tunnel layer;
    a second insulating layer formed on the charge storage layer;
    a control gate formed on the second insulating layer; and
    a pair of impurity regions which are interposed between the pair of conductor regions and the semiconductor region below the charge storage layer and in which an impurity having the same polarity as that of the semiconductor region is dosed.

9. The device according to claim 8, wherein an average particle diameter of the silicon-grains forming the semiconductor layer below the charge storage layer, which is a channel region, is less than a length of the charge storage layer in a direction along which the pair of conductor regions face each other, and the channel region includes at least one grain boundary intercepting a current path of the channel region.

10. The device according to claim 8, wherein a length of the charge storage layer is equal to or less than 30 nm.

11. The device according to claim 8, wherein the metal forming the pair of conductor regions contains at least one selected from the group consisting of Ni, Co, W, Ta, Pt, Mo, Ti, Cu, and Al.

12. The device according to claim 8, wherein the silicide forming the pair of conductor regions contains at least one selected from the group consisting of Ni, Co, W, Ta, Pt, Mo, and Ti.

13. A non-volatile semiconductor storage device having an NAND structure which includes a plurality of elements each of which is constituted of the non-volatile semiconductor storage device according to claim 8 and in which the plurality of elements are connected in series in a string form in such a manner that the elements adjacent to each other share one of the pair of conductor regions.

* * * * *